United States Patent
Yang et al.

(10) Patent No.: US 9,406,687 B1
(45) Date of Patent: Aug. 2, 2016

(54) INTEGRATION OF MEMORY DEVICES WITH DIFFERENT VOLTAGES

(71) Applicant: GLOBALFOUNDRIES Singapore Pte. Ltd., Singapore (SG)

(72) Inventors: Jianbo Yang, Singapore (SG); Yi Tat Lim, Singapore (SG); Sung Mun Jung, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/664,940

(22) Filed: Mar. 23, 2015

(51) Int. Cl.
*H01L 27/115* (2006.01)
*H01L 29/788* (2006.01)
*H01L 29/66* (2006.01)
*H01L 29/423* (2006.01)
*H01L 21/28* (2006.01)

(52) U.S. Cl.
CPC .... *H01L 27/11524* (2013.01); *H01L 21/28273* (2013.01); *H01L 29/42328* (2013.01); *H01L 29/66553* (2013.01); *H01L 29/66825* (2013.01); *H01L 29/788* (2013.01)

(58) Field of Classification Search
CPC ............ H01L 27/115; H01L 27/11524; H01L 29/42328; H01L 29/66553; H01L 29/66825; H01L 21/028273
See application file for complete search history.

(56) References Cited

U.S. PATENT DOCUMENTS

| | | | | |
|---|---|---|---|---|
| 2011/0037114 A1* | 2/2011 | Tsujita | ............... | H01L 21/28273 257/316 |
| 2014/0167139 A1* | 6/2014 | Chang | ................... | H01L 29/401 257/325 |
| 2014/0246724 A1* | 9/2014 | Jang | ....................... | G11C 5/025 257/368 |
| 2016/0064082 A1* | 3/2016 | Hong | ................. | G11C 16/0433 365/185.05 |

* cited by examiner

*Primary Examiner* — Phuc Dang
(74) *Attorney, Agent, or Firm* — Horizon IP Pte. Ltd.

(57) ABSTRACT

Device and method for forming a device are presented. The method includes providing a substrate prepared with at least a memory cell region having first and second sub-regions and a logic region having input/output (I/O) region and core region. First voltage memory cell is formed in the first sub-region and second voltage memory cell is formed in the second sub-region of the memory cell region of the same substrate. The first voltage memory cell operates in a first voltage and the second voltage memory cell operates in a second voltage which is higher than the first voltage. Each of the first and second voltage memory cells includes a split gate having first and second gates. The first gate is a storage gate having a control gate over a floating gate and the second gate is a wordline. Logic I/O device is formed in the I/O region and logic core device is formed in the core region.

20 Claims, 17 Drawing Sheets

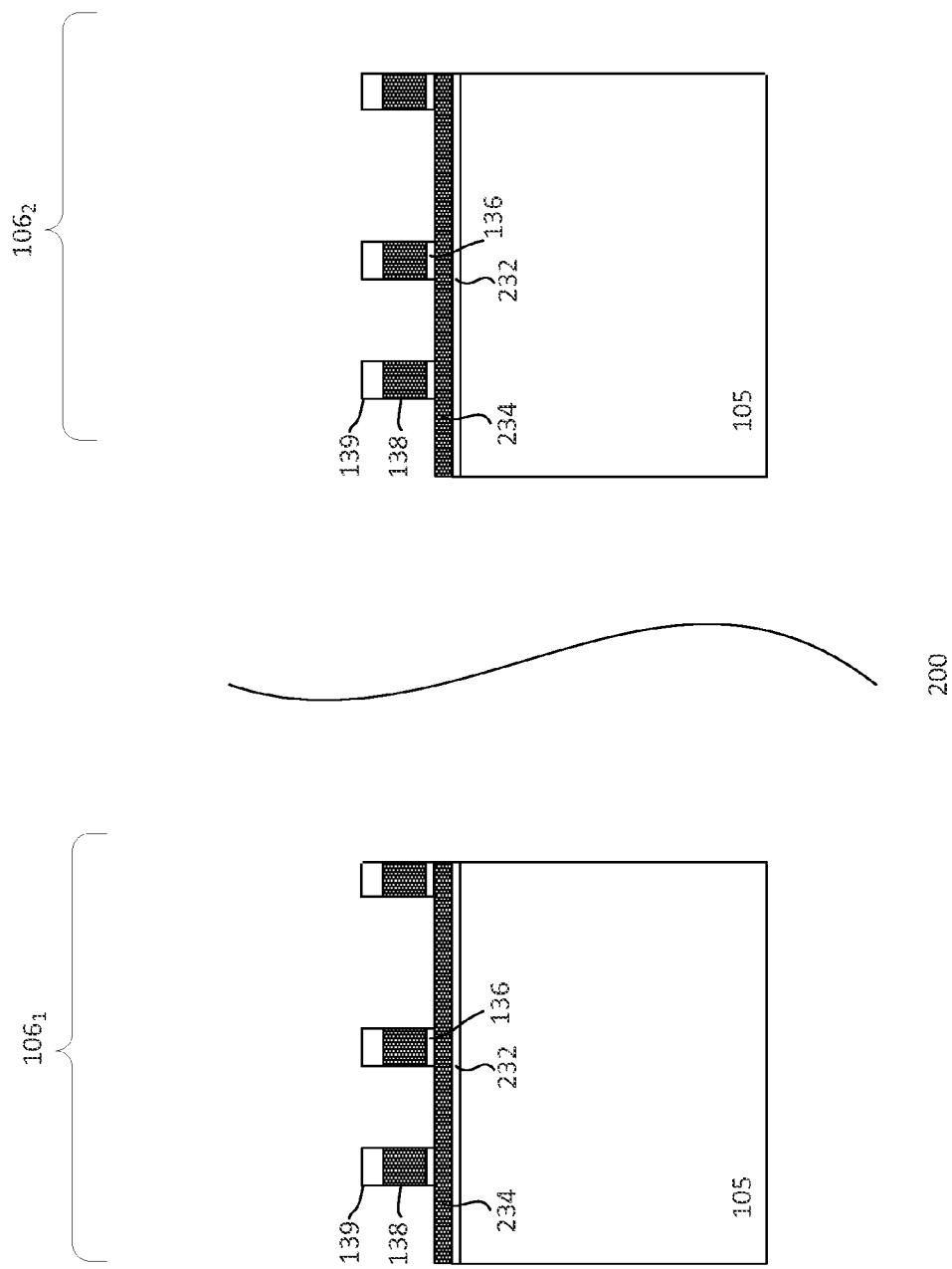

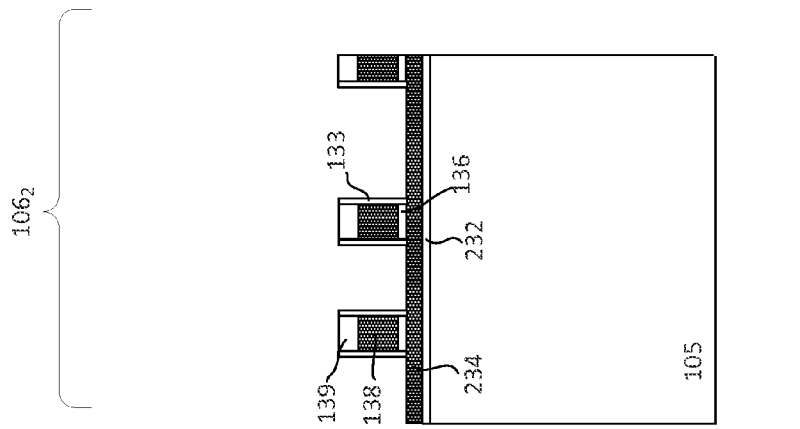
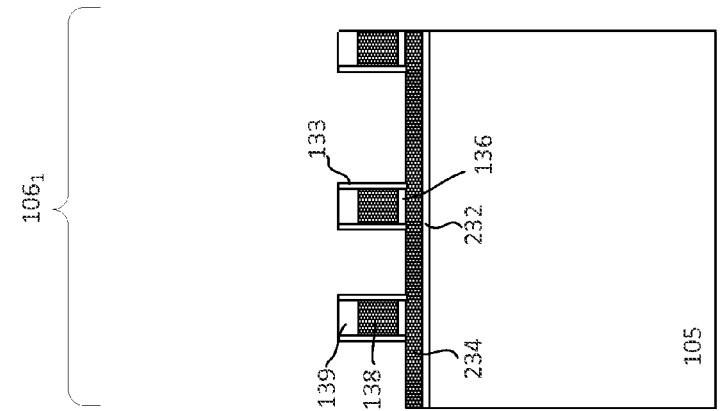
Fig. 2c

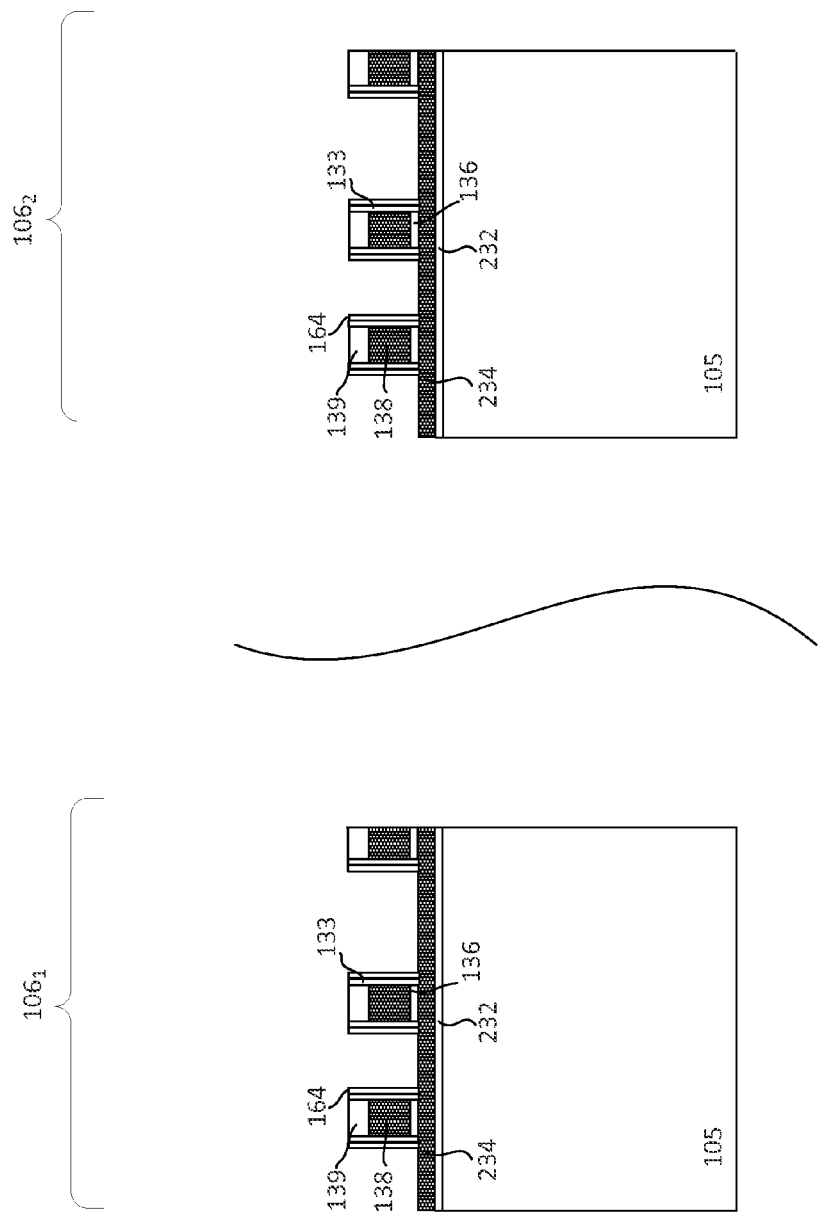

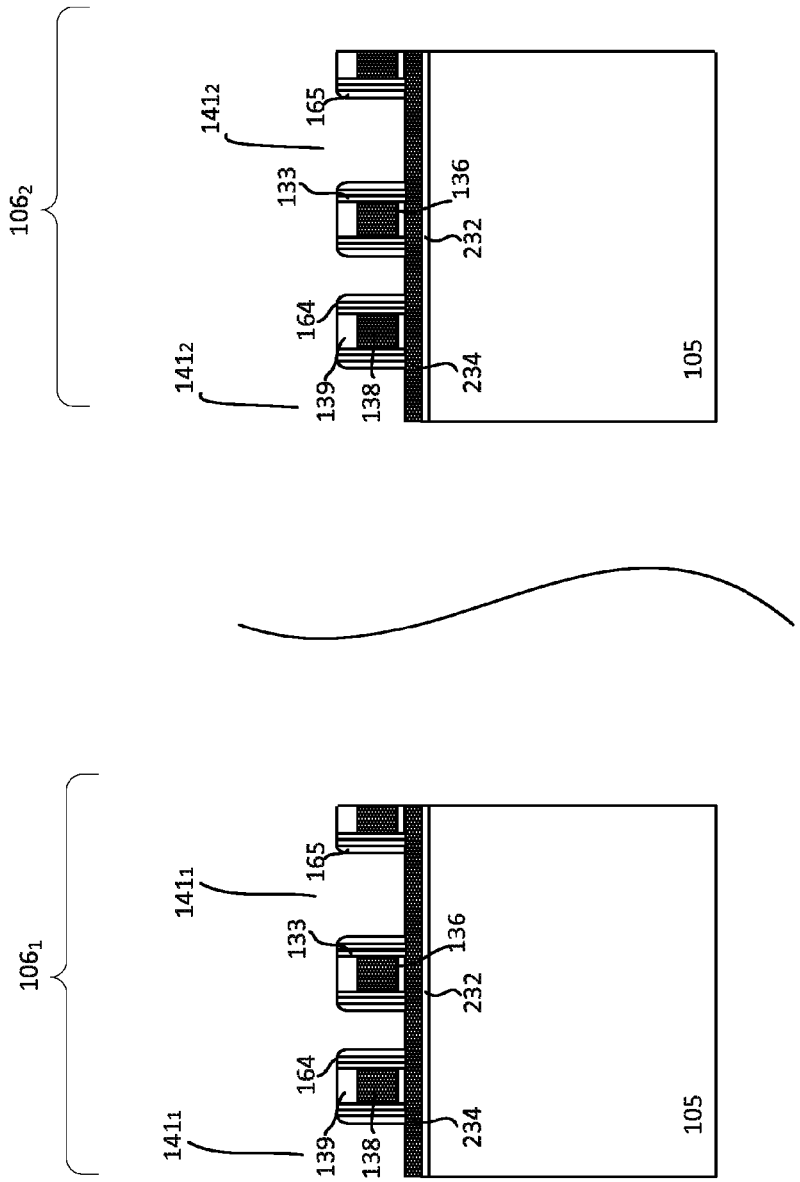

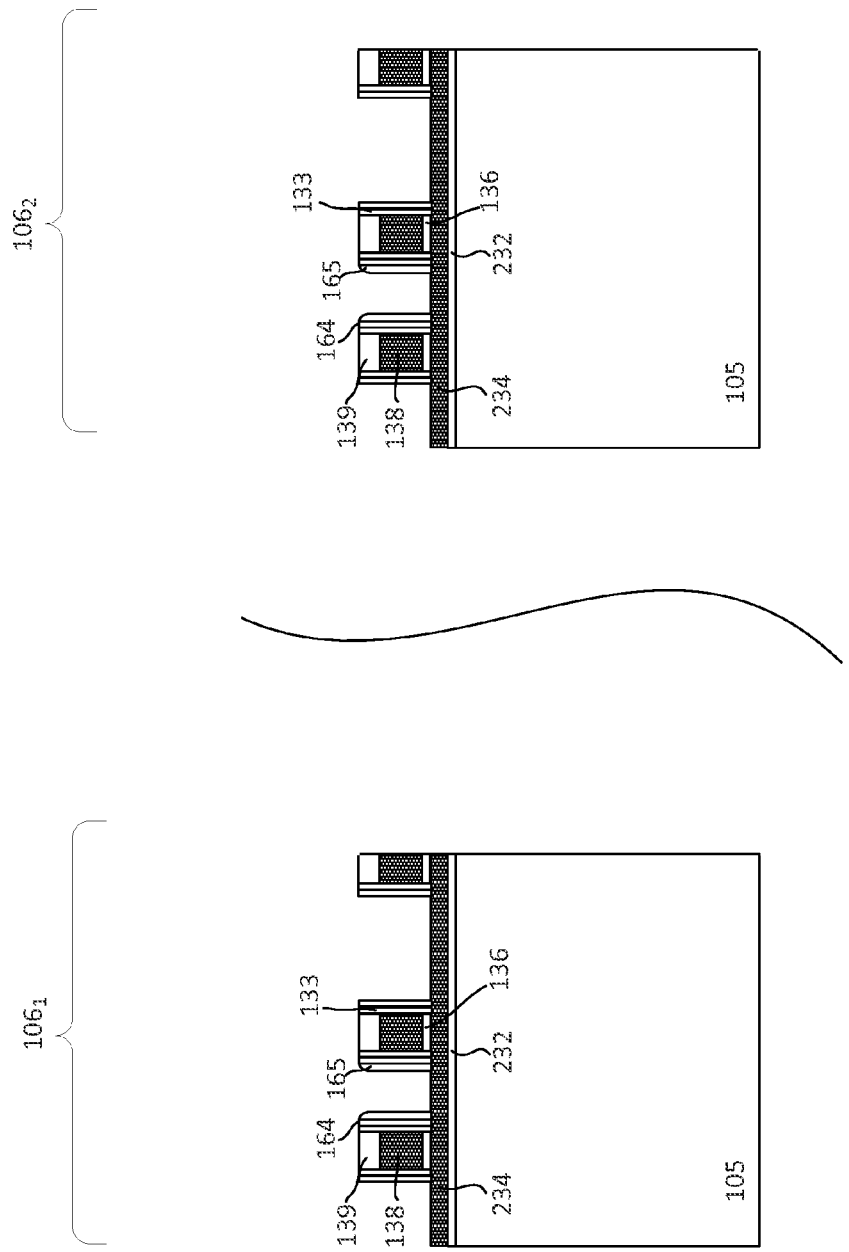

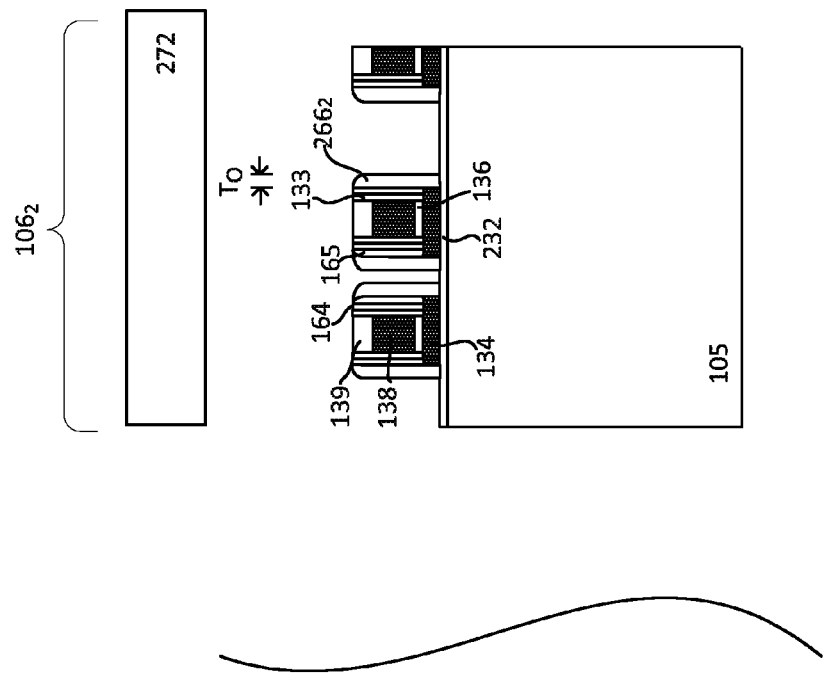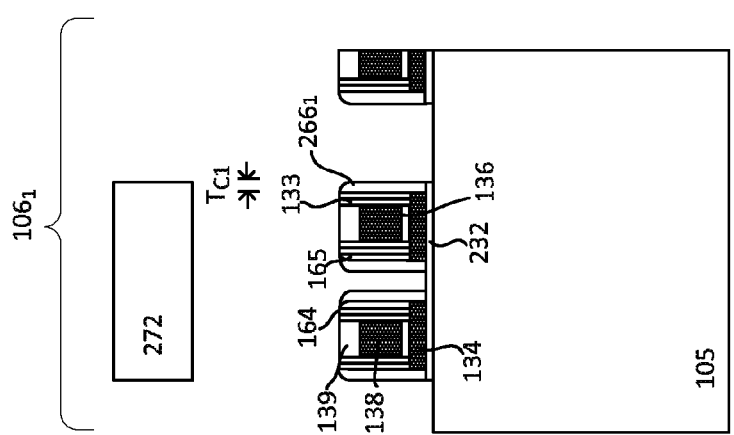
Fig. 2h

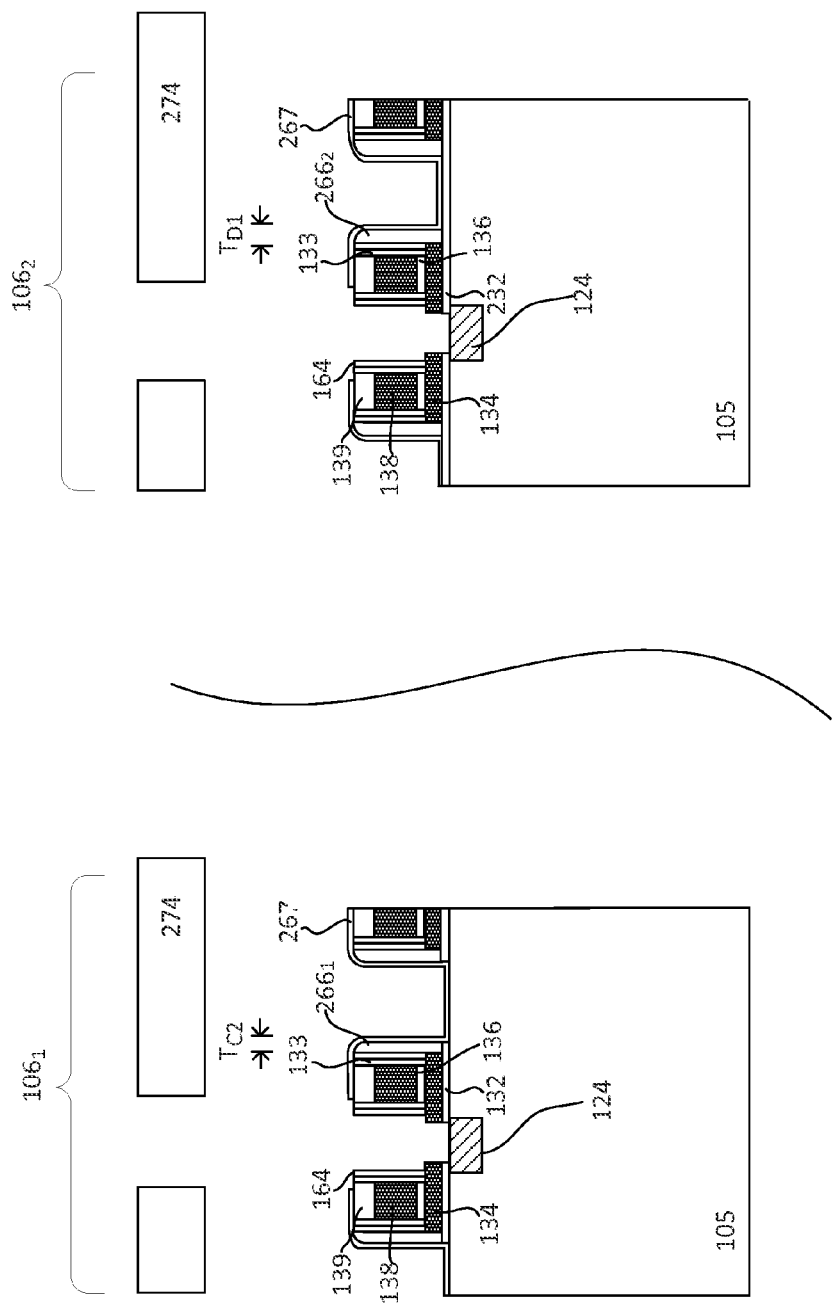

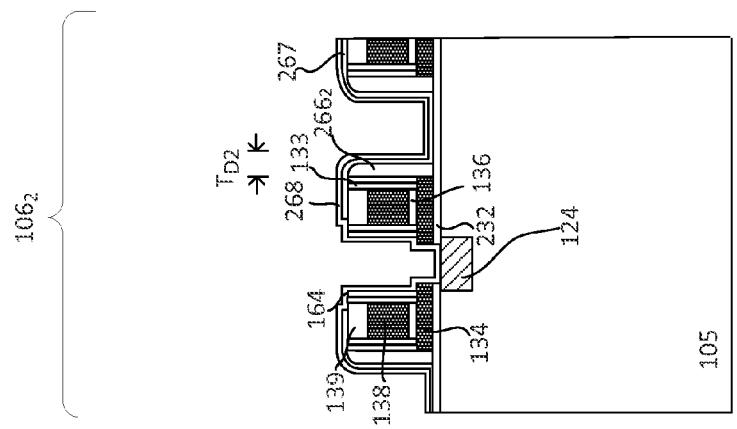
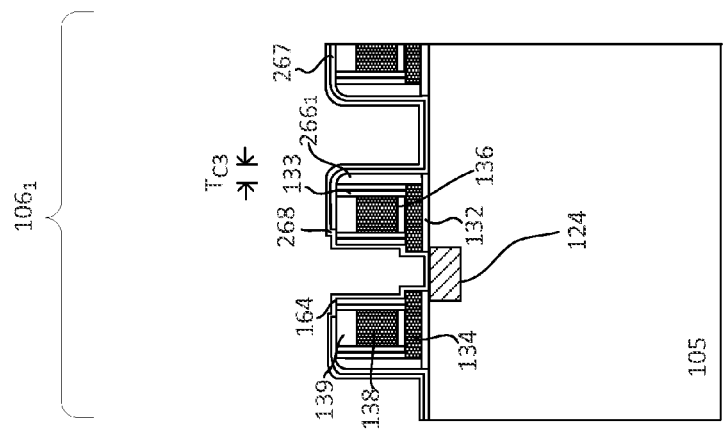
Fig. 2k

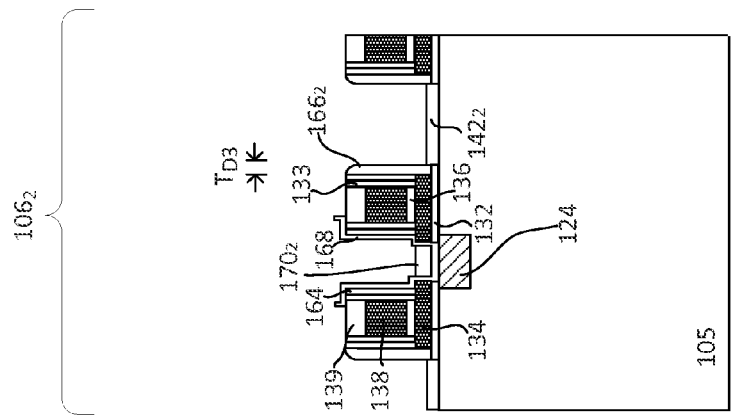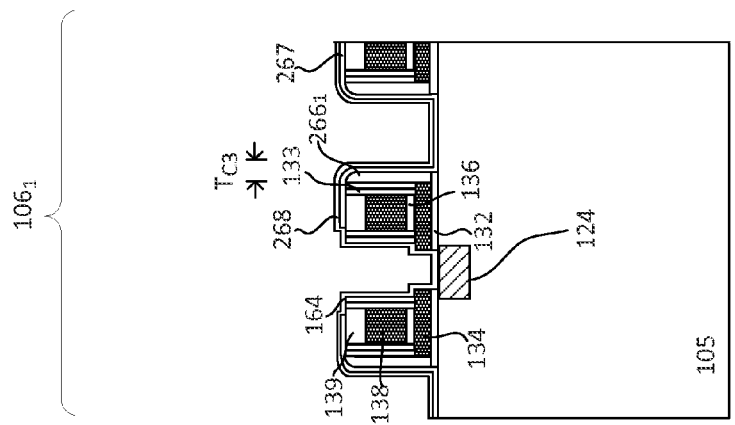
Fig. 2m

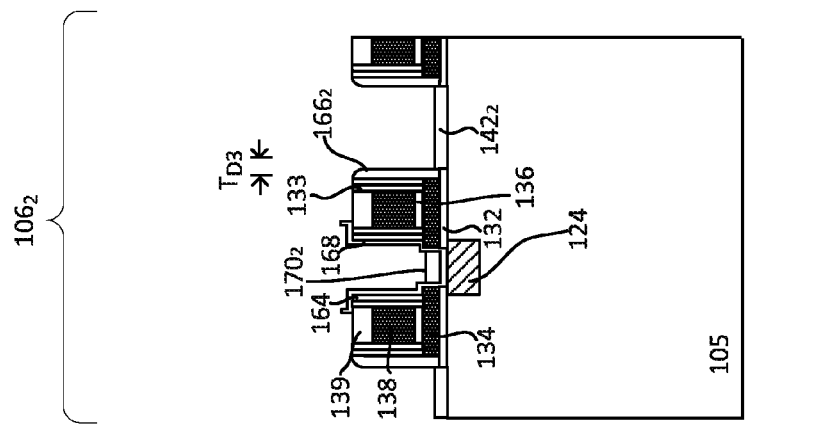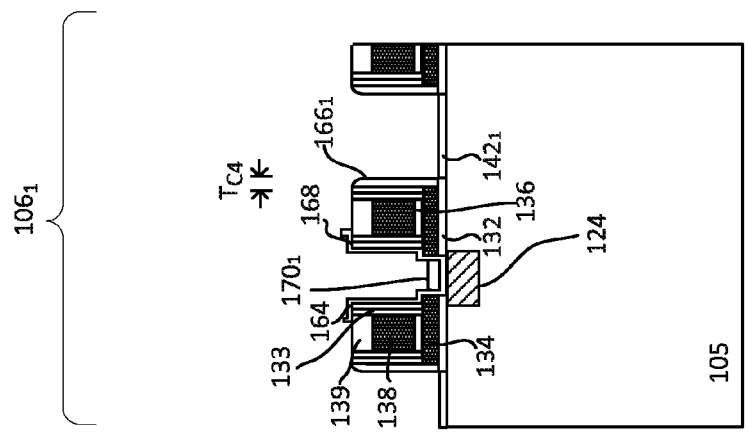
Fig. 2o

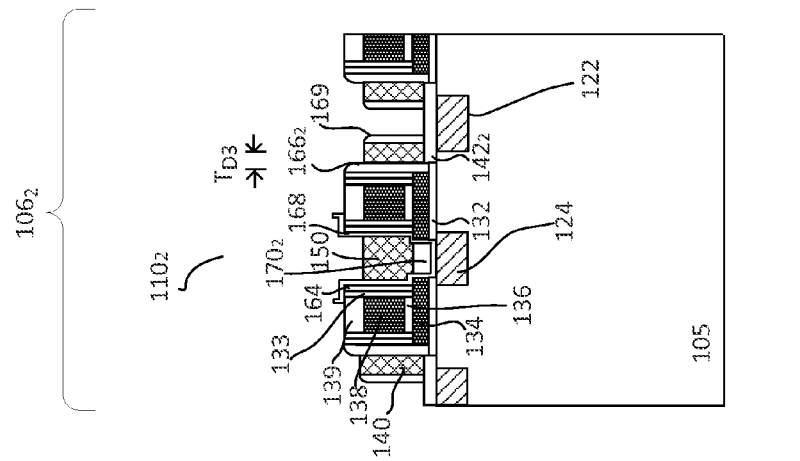
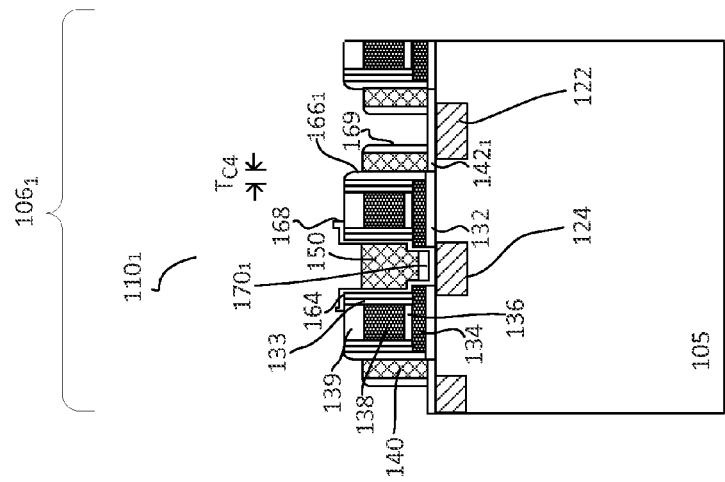
Fig. 2p

INTEGRATION OF MEMORY DEVICES WITH DIFFERENT VOLTAGES

BACKGROUND

Non-volatile memory (NVM) devices are able to retain stored data even when the power supply is interrupted. Non-volatile memory devices include flash devices which can be programmed using electrical signals. A NVM device, for example, includes a memory transistor and a select or access transistor in series. The memory transistor stores data programmed into the memory cell, while the access transistor selects the memory cell to be programmed or erased.

As technology evolves into era of sub-micron, there is a desire to integrate memory arrays of different voltages, high voltage (HV) devices and high speed logic circuit elements into a single chip or integrated circuit (IC) to form an embedded memory. Nevertheless, it is difficult to integrate these different types of devices in a single chip since each of these devices has different requirements. For example, the memory cell size for higher voltage application is bigger than the memory cell size for lower voltage application. As such, it is necessary to alter or change the processing steps to accommodate for the memory cells with different voltage applications. This, however, may compromise or affect reliability of some of the devices and undesirably complicates the manufacturing process and increases the manufacturing cost.

From the foregoing discussion, it is desirable to provide a reliable, high performing and simplified solution for integrating different types of devices in the same IC.

SUMMARY

Embodiments generally relate to semiconductor device and method for forming a device. In one embodiment, a method for forming a device is presented. The method includes providing a substrate prepared with at least a memory cell region having first and second sub-regions and a logic region having input/output (I/O) region and core region. First voltage memory cell is formed in the first sub-region and second voltage memory cell is formed in the second sub-region of the memory cell region of the same substrate. The first voltage memory cell operates in a first voltage and the second voltage memory cell operates in a second voltage which is higher than the first voltage. Each of the first and second voltage memory cells includes a split gate having first and second gates. The first gate is a storage gate having a control gate over a floating gate and the second gate is a wordline. Logic I/O device is formed in the I/O region and logic core device is formed in the core region.

In another embodiment, a device is disclosed. The device includes a substrate which comprises at least a memory cell region having first and second sub-regions and a logic region having input/output (I/O) region and core region. First voltage memory cell is disposed in the first sub-region and second voltage memory cell is disposed in the second sub-region of the memory cell region of the same substrate. The first voltage memory cell operates in a first voltage and the second voltage memory cell operates in a second voltage which is higher than the first voltage. Each of the first and second voltage memory cells comprises a split gate having first and second gates. The first gate is a storage gate having a control gate over a floating gate and the second gate is a wordline. Logic I/O device is disposed in the I/O region and logic core device is disposed in the core region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Embodiments generally relate to semiconductor devices. More particularly, some embodiments relate to devices having non-volatile memory (NVM) cells with different voltages integrated with logic and high voltage devices on the same substrate. Such devices can be incorporated into integrated circuits (ICs) and easily integrated into logic processing technologies without compromising the reliabilities of the different devices. Such devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1:
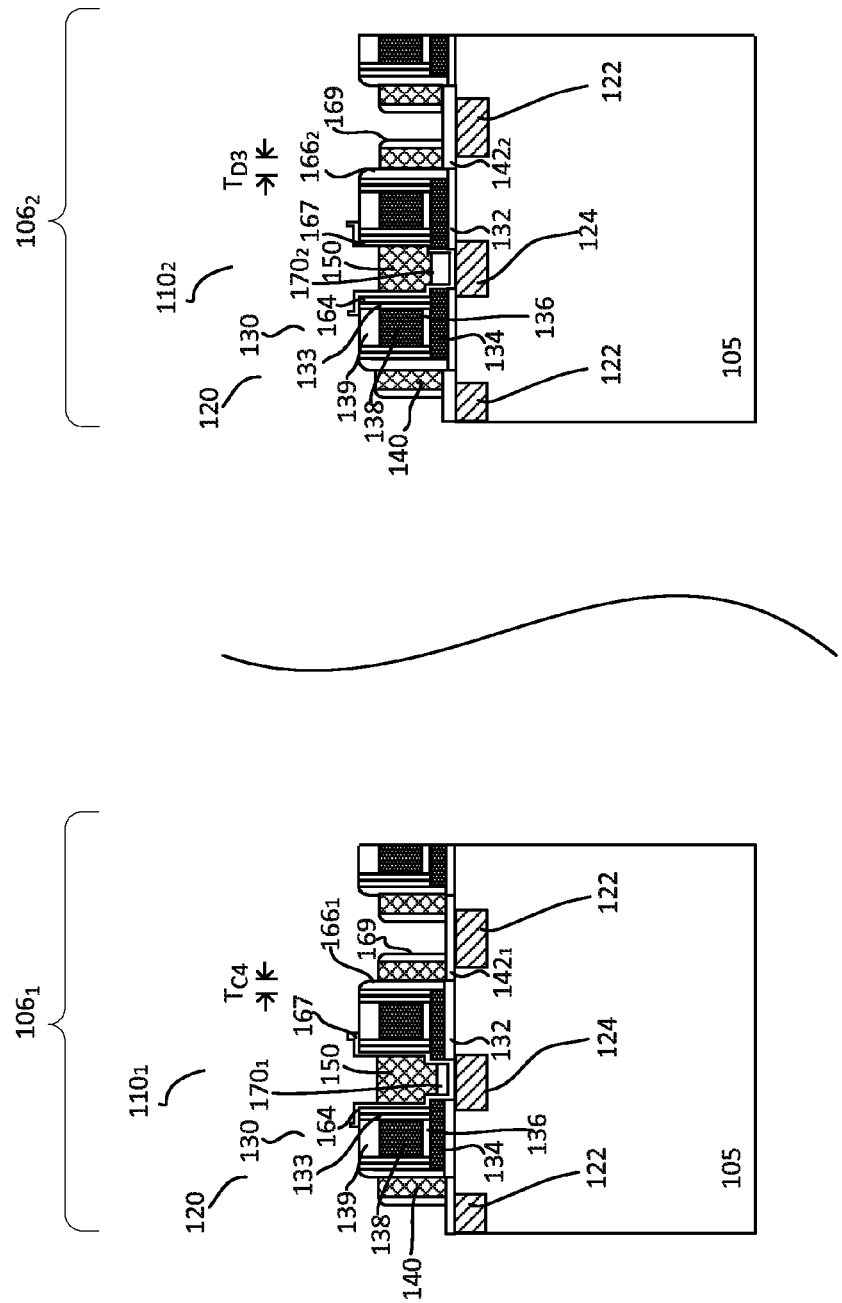
FIG. 1 shows a cross-sectional view of an embodiment of a portion of a device.
Figure 2A:
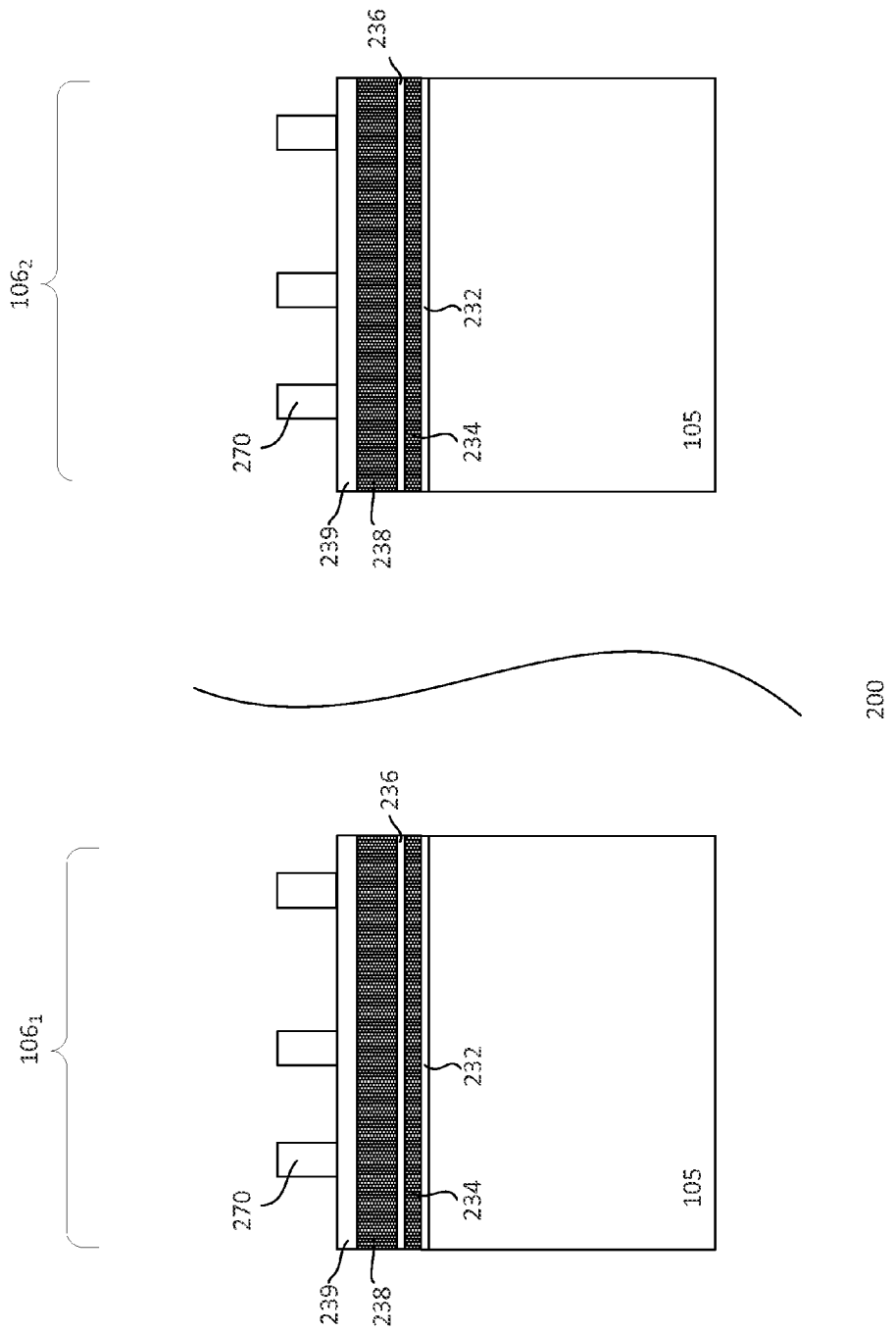
FIGS. 2a-2p show an embodiment of a process for forming a device.

FIG. 1 and FIGS. 2a-2p, some reference numerals may include a subscript. The subscript indicates which memory cell of the element is associated. For example, a reference numeral with a subscript 1 indicates that the element is associated with the memory cell in the first sub-region of the memory cell region; a reference numeral with a subscript 2 indicates that the element is associated with the memory cell of the second sub-region of the memory cell region. In some instances, the description may refer to elements general to both memory cells in the first and second sub-regions without including the subscript.

FIG. 1 shows a cross-sectional view of an embodiment of a portion of a device 100. The device includes a substrate 105. The substrate, for example, may be a silicon substrate. The substrate can be lightly doped with p-type dopants. Other suitable types of semiconductor substrates may also be used. For example, the substrate may be silicon germanium or silicon-on-insulator (SOI) as well as intrinsic or doped with other types of dopants or dopant concentrations.

The substrate may be prepared with a memory region containing memory cells of the device. The memory region can be referred to as an array region. The array region, in one embodiment, includes first sub-region $106_1$ and second sub-region $106_2$. Other suitable number or types of regions or sub-regions may also be included in the array region. In one embodiment, the first sub-region $106_1$ is suitable for first voltage memory cells. The first voltage memory cells are suitable to operate in first or low voltage ranges, for example, about 1.2 V. The second sub-region $106_2$, in one embodiment, is suitable for second voltage memory cells. The second voltage memory cells are suitable to operate in second voltage ranges which are higher than the first voltage ranges. The second voltage ranges, for example, include voltage ranges which allow the second voltage memory cells to operate in the same voltage ranges as the logic input/output (I/O) devices. For example, the second voltage memory cells are suitable to operate in a second voltage of about 2.5 V. Other suitable voltages for the first and second sub-regions may also be useful.

The substrate 105 is also prepared with other suitable types of regions (not shown). For example, the substrate may include a logic region for support or other types of logic circuitry. The substrate may also include regions for other types of circuitry, depending on the type of device or IC. For example, the logic region may include sub-regions for high voltage (HV), medium voltage (MV) and low voltage (LV) devices. The logic region for LV devices, for example, may include input/output (I/O) region and core region.

Illustratively, each of the sub-regions of the array region includes three transistors of which two of the transistors form a memory cell pair 110 while the remaining transistor is a transistor of an adjacent memory cell pair. For example, the two transistors are of memory cells of a memory cell pair corresponding to two adjacent rows which share a common source (SL) which will be described later while the remaining transistor is a memory cell of an adjacent memory cell pair. The pair of memory cells may be adjacent memory cells of a column of memory cells. It is understood that the sub-regions of the array region includes many more memory cell pairs which form columns and rows of memory cells. In one embodiment, the memory cells are NVM memory cells. Providing other types of memory cells may also be useful. The array may be configured to have sub-arrays or sectors.

The array region may include doped wells (not shown) with dopants of a second polarity type. The doped wells may be intermediately or heavily doped. Providing doped wells having other dopant concentrations may also be useful. The doped wells include suitable dopant concentrations, depending on the desired operation voltage for the memory cells. The second polarity type doped well serves as a well for a first polarity type device. In one embodiment, the second polarity type includes p-type. For example, the p-type doped well serves as a well for a n-type memory cell. Providing a n-type doped well may also be useful. For example, a n-type doped well serves as a well for p-type memory cells. P-type dopants can include boron (B), aluminum (Al), indium (In) or a combination thereof while n-type dopants can include phosphorus (P), arsenic (As), antimony (Sb) or a combination thereof.

The substrate includes isolation regions (not shown) to isolate active device regions from other active device regions, as required. The isolation regions, for example, are shallow trench isolation (STI) regions. Other types of isolation regions are also useful. For example, isolation regions may be used to isolate rows and columns of memory cells.

In general, a memory cell includes a cell transistor with a gate 120 between first and second cell terminals or source/drain (S/D) regions 122 and 124. The gate, in one embodiment, is a split gate. For example, the split gate includes first and second gates 130 and 140. The first gate, for example, is a storage gate. The storage gate includes a control gate 138 and a floating gate 134. The gates, for example, are polysilicon gates. Other suitable types of gate materials may also be useful. The floating gate is separated from the substrate by a floating gate dielectric 132 and the control gate is separated from the floating gate by a storage gate dielectric 136. The floating gate dielectric, in one embodiment, is a thermal oxide. As for the storage gate dielectric, it is an oxide/nitride/oxide (ONO) stack. Other suitable types of floating gate or storage gate dielectrics may also be useful.

The storage gate includes a hard mask 139 over it. For example, the hard mask is disposed over the control gate. The hard mask, for example, is silicon nitride. Other suitable types of hard mask or dielectric materials may also be useful. The hard mask, for example, may be used to define the control gate and storage gate dielectrics.

As for the second gate 140, it serves as an access gate or wordline. The second gate is disposed adjacent to the storage gate and first cell terminal 122. The second or access gate is separated from the substrate by an access gate or wordline dielectric 142. The access gate or wordline, for example, may be polysilicon. Other suitable types of gate materials may also be useful. The access gate dielectric may be thermal oxide. For example, the wordline dielectric and floating gate dielectric may be formed of the same thermal oxide material. Other suitable configurations of the access gate may also be useful. The storage gate and access gate may be gate conductors. For example, the gates form common gates for a row of memory cells.

The first and second cell terminals or S/D regions 122 and 124 are heavily doped first polarity type doped regions. For example, first polarity type doped S/D regions are for first polarity type cell transistors. In one embodiment, the first polarity type is n-type for a n-type cell transistor. Providing p-type SD regions may also be useful for p-type cell transistors. In one embodiment, the second S/D region 124 serves as a source line (SL) of the memory cell. The second S/D region, for example, is a common S/D region for a row of memory cells.

A third gate 150 is disposed over the second S/D region 124. The third gate serves as an erase gate. The erase gate, for example, is a polysilicon gate. Other suitable types of gate materials may also be useful. The erase gate is isolated from the second S/D region by an erase gate dielectric 170. The erase gate dielectric, for example, is a thermal oxide layer. Other suitable dielectric materials may also be used as the erase gate dielectric. The thickness of the erase gate dielectric should be sufficient to electrically isolate the erase gate from the second S/D region.

Dielectric spacers may be provided on sidewalls of the gates. The spacers may provide electrical separation between the gates and may serve to facilitate forming lightly doped diffusion (LDD) and halo regions (not shown) in the S/D regions. The spacers may be spacer stacks having multiple dielectric layers. Sidewalls of the hard mask, control gates and storage gate dielectrics include first sidewall spacers 133. The first sidewall spacers, for example, are oxide spacers and are about 50 Å thick. The first sidewall spacers 133, for example, are high temperature oxide (HTO) spacers. Other suitable types of spacers and thicknesses may also be useful. Second or nitride spacers 164 are disposed over the first sidewall spacers 133. The nitride spacers, for example, may serve as control gate spacers for the isolation between control gate and wordline gate. The nitride spacers, for example, are disposed over the first sidewall spacers which cover sidewalls of the hard mask, control gates and storage gate dielectrics. A floating gate spacer 166 is disposed on the nitride spacer on the access gate or wordline side of the storage gate. The floating gate spacer 166, for example, is a HTO spacer, separating the access gate or wordline from the storage gate. An oxide spacer 168 is disposed on the nitride spacer on the erase gate side of the storage gate. A lower portion of the oxide spacer 168 serves as a tunneling oxide between the floating gate and erase gate. As for the spacer 169 on sidewall of the wordline adjacent to the first cell terminal, it includes a low temperature oxide (LTO) and nitride. The spacers, for example, are formed using spacer techniques, such as anisotropically etching the layers to remove horizontal portions while vertical portions of the layers remain as the spacers. Other suitable configurations of spacers may also be useful.

In one embodiment, the floating gate electrode and floating gate dielectric are wider than the control gate. For example, the floating gate electrodes extend beyond the control gate and nitride spacers. The cell transistors of the memory cell pair share a common second S/D region. Likewise, the cell transistors of the memory cell pair share a common erase gate. An erase gate line (EGL) is coupled to the erase gate and a SL is coupled to the second S/D region. For a memory cell pair, a first wordline is coupled to the second gate of the first cell transistor and a first control gate line is coupled to the control gate of the first cell transistor; a second wordline is coupled to the second gate of the second cell transistor and a second control gate line is coupled to the control gate of the second cell transistor. Alternatively, the second gate of the second cell transistor serves as the first wordline while the second gate of the first cell transistor serves as the second wordline. As for the first terminals of the cell transistors, they are coupled to a common bitline (BL). For example, the cells of the memory cell pair are part of the same column of memory cells. Memory cells may be interconnected by WLs, CGLs, EGLs, SLs and BLs (not shown) to form a memory array.

A dielectric layer (not shown) is disposed over the memory cells. The dielectric layer, for example, serves as a contact level of an interlevel dielectric (ILD) layer. For example, the dielectric layer serves as a contact level or CA level of the first ILD level or layer. Contacts (not shown) are formed to the various terminals of the memory cell. For example, contacts are coupled to the first and second S/D regions, control gates and access gates of the memory cell. Contact in the CA level may be tungsten contacts. Other suitable types of contacts may also be useful. Conductive lines may be provided in a metal level of the ILD layer above the contact level dielectric layer. For example, conductive lines may be provided in the first metal level (M1) of the first layer. Conductive lines in M1 may be copper conductive lines. Contacts and conductive lines in CA and M1 may be formed by single damascene techniques. Additional ILD layers with contact and metal levels are provided. Contacts and conductive lines in the additional ILD layers may be copper contacts and formed by, for example, dual damascene technique.

Lines disposed in the same direction may be provided in the same metal level. Different direction lines are provided in different metal levels. For example, in the case where CGLs, WLs, SLs and EGLs are disposed in a first direction, they may be disposed in the same metal level, such as M1 while BLs which are disposed in a second direction, may be provided in a different metal level, such as the second metal level (M2). Other suitable configurations of conductive lines may also be useful.

As described, the substrate 105 includes at least first and second sub-regions $106_1$ and $106_2$ in the array region and other regions such as logic regions, which include HV and LV regions. In one embodiment, the first sub-region $106_1$ is suitable for memory cells which are operating in, for example, first or low voltage ranges while the second sub-region $106_2$ is suitable for memory cells operating in, for example, second voltage ranges which are higher than the first voltage ranges and these regions are disposed on the same substrate. The size of the memory cell in the first sub-region, for example, is smaller than the size of the memory cell in the second sub-region in view of their application in different voltage regimes. The width of the gates in the first sub-region are defined such that it is suitable for use in a first voltage, for example, about 1.2 V application while the width of the gates in the second sub-region is defined such that it is suitable for use in a second voltage, for example, about 2.5 V application. For example, the control gate width is about 80 nm and about 135 nm is used for 1.2 V cell wordline gate width. As for the 2.5 V application, the control gate width is, for example, about 90 nm and about 150 nm is used for the 2.5 V cell wordline gate width. Other suitable gate width dimensions may also be useful. In addition, the S/D regions in the first and second sub-regions include suitable dopant concentrations which are desired for operating in different voltage regimes.

The floating gate spacers 166 correspond to main portion of the wordline-floating gate gap oxides. As the first and second sub-regions are prepared for operating in different voltage ranges, the requirements for the floating gate spacers which correspond to wordline-floating gate gap oxide in the first and second sub-regions are different. For example, the floating gate gap oxide $166_1$ for first voltage memory cell is generally thinner relative to the floating gate gap oxide $166_2$ for second voltage memory cell which operates in second voltage which is higher than the first voltage. In one embodiment, the final thickness $T_{C4}$ of the floating gate spacers $166_1$ which are disposed in between adjacent memory cell pair in the first sub-region $106_1$ is, for example, about 180 Å while the final thickness $T_{D3}$ of the floating gate spacers $166_2$ which are disposed in between adjacent memory cell pair in the second sub-region $106_2$ is, for example, about 200 Å. Other suitable final thickness dimensions for the floating gate spacers may also be useful as long as they do not affect the programming efficiency of the memory cells based on the first and second voltage values. Furthermore, in one embodiment, the wordline dielectric $142_1$ in the first sub-region $106_1$ is formed simultaneously with the logic core gate dielectric of the logic region while the wordline dielectric $142_2$ in the second sub-region $106_2$ is formed simultaneously with the logic input/output (I/O) gate dielectric of the logic region as will be described later. In one embodiment, the thickness of the wordline dielectric $142_1$ in the first sub-region is, for example, about 25 Å while the thickness of the wordline dielectric $142_2$ in the second sub-region is, for example, about 58 Å. The wordline dielectric and the wordline-floating gate gap oxide of the respective regions include dimensions which are suitable for its desired voltage application. As such, the memory cells with different voltages can be easily integrated into existing or other logic processing technologies. The reliability of the respective memory devices of different voltages is not compromised even if they are formed on the same substrate.

FIGS. 2a-2p show cross-sectional views of an embodiment of a process 200 for forming a device. The cross-sectional views, for example, are along the bitline direction of the device. The device, for example, is similar to that described in FIG. 1. Common elements may not be described or described in detail. The cross-sectional views illustrate a portion of the device. For example, the cross-sectional views illustrate a portion of the array region of the device. As discussed, the device may include other device regions (not shown), such as logic regions, including HV and LV regions which further include input/output (I/O) and core regions. The various regions include device wells for respective devices. For example, array region includes at least first and second sub-regions with respective array wells while HV regions include HV p wells for HV n-type devices and HV n wells for HV p-type devices and LV regions include LV p wells for LV n-type devices and LV n wells for LV p-type devices.

Referring to FIG. 2a, initial front end of line (FEOL) processing is performed on the substrate 105. For example, the substrate is prepared with isolation regions (not shown), such as shallow trench isolation (STI) regions, defining active regions of the device. For example, exposed portions of the substrate not filled with isolation regions serve as active regions of the device. The active regions, for example, include array, HV and LV regions. For illustration purpose, only the array region of the substrate is shown.

The array region, in one embodiment, includes at least first sub-region $106_1$ and second sub-region $106_2$. Providing other suitable number or types of regions or sub-regions may also be useful. In one embodiment, the first sub-region $106_1$ is a memory cell region suitable for first voltage memory cells. The first voltage memory cells are suitable to operate in first or low voltage ranges, for example, about 1.2 V. The second sub-region $106_2$, in one embodiment, is a memory cell region suitable for second voltage memory cells. The second voltage memory cells are suitable to operate in second voltage ranges which are higher than the first voltage ranges. The second voltage ranges, for example, include voltage ranges which allow the second voltage memory cells to operate in the same voltage ranges as the logic input/output (I/O) devices. For example, the second voltage memory cells are suitable to operate in a second voltage of about 2.5 V. Other suitable voltages for the first and second sub-regions may also be useful.

After forming the isolation regions, wells are formed in the substrate. For example, doped wells (not shown) are formed in the array region and the logic region. The logic region, for example, may include HV and LV regions. The wells may be formed by performing ion implantation using implant masks, such as photoresist. Different wells are formed using different implant processes.

Various gate layers are formed on the substrate. This, for example, includes forming a floating gate dielectric layer 232, a floating gate electrode layer 234, a storage gate dielectric layer 236, a control gate electrode layer 238, and a hard mask layer 239. The floating gate dielectric layer, for example, includes oxide material. The floating and control gate electrode layers, for example, include polysilicon while the storage gate dielectric layer 236, for example, is an oxide-nitride-oxide (ONO) stack. The hard mask layer, for example, may include silicon nitride. Other suitable types of materials may also be useful for the various gate layers. The various gate layers may be formed by, for example, chemical vapor deposition (CVD) technique. Other suitable types of forming techniques may also be useful.

The process includes patterning some of the gate layers. Patterning the gate layers may be achieved using mask and etch techniques. For example, a patterned resist mask 270 may be employed to serve as an etch mask. Patterning the resist mask may be performed by selectively exposing a resist layer with after exposure source using a reticle. The pattern of the reticle is transferred to the resist layer after exposure by a development process. The patterned resist layer serves as an etch mask for an anisotropic etch, such as a reactive ion etch (RIE). The etch transfers the pattern of the mask to the underlying layers. In one embodiment, the etch removes exposed portions of the hard mask, control gate electrode and storage gate dielectric layers not covered by the patterned resist mask in the array and non-array regions. The etch removes exposed portions of the hard mask layer, followed by removing exposed portions of the control gate electrode and storage gate dielectric layer. In one embodiment, the etch process stops on top of the floating gate electrode layer.

The hard mask, control gate electrode and storage gate dielectric layers are patterned in the array sub-regions as shown in FIG. 2b. For example, the hard mask and control gate electrode layers are selectively patterned to form patterned hard mask 139, control gates 138 and storage gate dielectrics 136. Illustratively, each of the sub-regions includes three transistors of which two of the transistors form a memory cell pair while the remaining transistor is a transistor of an adjacent memory cell pair. For illustration purpose, the gate layers are patterned such that two control gates are of memory cells of a memory cell pair corresponding to two adjacent rows which share a common source (SL) which will be described later while the remaining control gate is part of a memory cell of an adjacent memory cell pair. It is understood that the sub-regions of the array region includes many more memory cell pairs which form columns and rows of memory cells. Additionally, hard mask, control gate electrode and storage dielectric layers in the non-array regions are removed. For example, the hard mask, control gate electrode and storage gate dielectric layers above the floating gate electrode layer are removed in the non-array regions.

The etch, in one embodiment, defines the control gates and storage gate dielectrics of the memory cells. The size of the memory cell in the first sub-region $106_1$, for example, is smaller than the size of the memory cell in the second sub-region $106_2$ in view of their application in different voltage regimes. The width of the control gate in the first subregion is defined such that it is suitable for use in a first voltage. The first voltage is, for example, about 1.2 V. The width of the control gate in the second sub-region is defined such that it is suitable for use in a second voltage. The second voltage is, for example, about 2.5 V. Other suitable voltage values may also be useful. Thus, the hard mask, the control gates and the storage gate dielectrics are patterned according to the desired cell size in various voltage applications.

The patterned resist mask 270 is removed after patterning some of the gate layers. The patterned resist mask is removed, for example, by ashing. Other suitable techniques may be used to remove the patterned resist.

In one embodiment, the substrate is subjected to an oxidation process. The oxidation process, for example, includes high temperature oxidation (HTO) deposition and anneal. The oxidation process forms first sidewall spacers 133 on sidewalls of the hard mask, control gates and storage gate dielectrics. The first sidewall spacers, for example, are oxide spacers and are about 50 Å thick. Other suitable thicknesses, for example, may also be useful. As shown in FIG. 2c, the first side all spacers 133 lines the exposed sides of the hard mask 139, control gates 138 and storage dielectrics 136.

In FIG. 2d, a second spacer layer is formed on the substrate. The second spacer layer lines the surface of the substrate. For example, the second spacer layer lines the exposed portions of the first sidewall spacers 133, hard mask and floating gate electrode layer in the array region while lining the floating gate electrode layer in the non-array or logic region. In one embodiment, the second spacer layer is a nitride layer formed by CVD. Other suitable types of dielectric spacer layer may also be useful.

An anisotropic etch, such as RIE, is performed, as shown in FIG. 2d. The etch, for example, removes horizontal portions of the second spacer layer selectively to the floating gate electrode layer, forming nitride spacers 164 on sidewalls of the control gate while leaving the floating gate electrode layer remaining. For example, control gate spacers 164 are formed over the first sidewall spacers 133 on sidewalls of the hard mask, control gates and storage gate dielectrics.

Referring to FIG. 2e, sacrificial spacers 165 are formed on sidewalls of the nitride spacers. The sacrificial spacers, for example, are oxide spacers. The spacers may be formed by forming a spacer layer on the substrate, such as an oxide spacer layer. The spacer layer may be formed by CVD. Other suitable techniques for forming the spacer layer may also be useful. A RIE is performed on the spacer layer, removing the horizontal portions to form the sacrificial spacers.

Gate threshold voltage (Vt) adjustment implants may be performed for the wordline of the memory cells having different voltages. The implants may be performed using implant masks (not shown). For example, the first implant mask may be a resist mask with openings to the regions $141_1$ where access gate or wordline of the first voltage memory cells are to be formed while the second implant mask may be a resist mask with openings to the regions $141_2$ where access gate or wordline to the second voltage memory cells are to be formed. The openings may also expose a portion of the control gate on the access gate side. The implants are different for the first and second sub-regions. For example, a first dose and first dopant concentrations will be introduced to the exposed regions of the first sub-region while a second dose and second dopant concentration which are different than the first dose and first dopant concentration will be introduced to the exposed regions of the second sub-region.

After the Vt adjustment implants, the sacrificial spacers 165 on the access gate or wordline side of the control gates are removed as shown in FIG. 2f. For example, the sacrificial spacers exposed by the implant masks are removed. Removal of the exposed sacrificial spacers may be achieved by, for example, a wet etch. Thereafter, the implant masks are removed by, for example, aching. Other suitable removal techniques may also be employed.

Figure 2G:
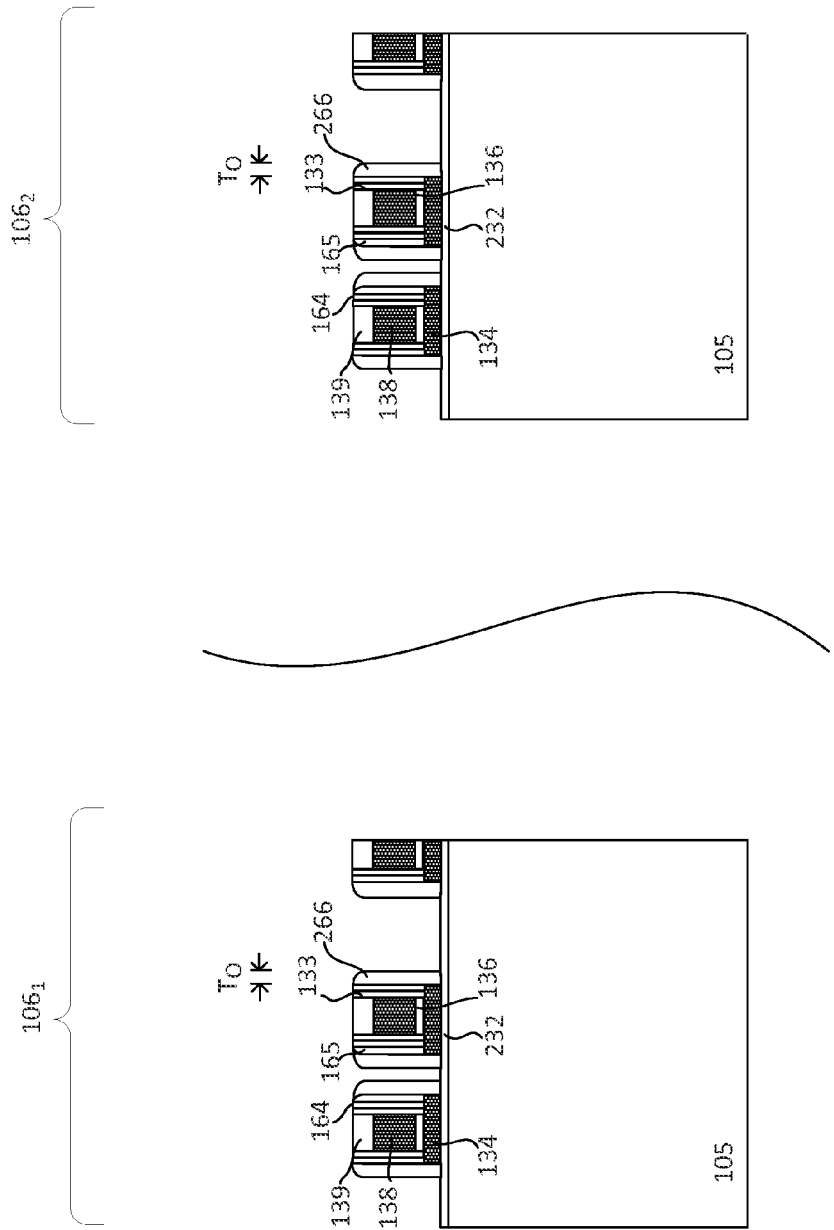

The process continues with a removal process. For example, a RIE is performed on the substrate. The etch removes exposed portions of the floating gate electrode layer 234 in the array and non-array regions. The sacrificial and the nitride spacers on the control gates serve as an etch mask for the RIE. The RIE, illustratively, keeps the underlying floating gate dielectric layer 232 remains over the substrate. The etch forms or defines the floating gates 134 as shown in FIG. 2g. The control and floating gates together serve as a first storage gate of a transistor of a memory cell.

As described, the size of the memory cell in the first sub-region, for example, is smaller than the size of the memory cell in the second sub-region in view of their application in different voltage regimes. The width of the floating gate in the first sub-region is defined such that it is suitable for use in a first voltage, for example, 1.2 V application while the width of the floating gate in the second sub-region is defined such that it is suitable for use in a second voltage, for example, 2.5 V application. Other suitable voltage values may also be useful. Thus, the floating gate electrode layer in the array region is patterned according to the desired cell size suitable for respective desired voltage applications.

After patterning the substrate to form the floating gates, floating gate spacers 266 are formed. To form the floating gate spacers, a floating gate spacer layer having a thickness of, for example, about 280 Å is formed on the substrate. Other suitable thickness dimension for the floating gate spacer layer may also be useful. The floating gate spacer layer, for example, is a HTO spacer layer. A RIE is performed to remove horizontal portions of the spacer layer, leaving floating gate spacers having a thickness $T_O$ of, for example, about 250 Å on sidewalk of the first gates, including the floating gates. Other suitable thickness dimension for the floating gate spacers may also be useful.

The process may continue to process the logic region (not shown) and portion of the first sub-region $106_1$ of the array region. For example, the HV regions (not shown) and wordline portion of the first sub-region $106_1$ of the array region may be selectively processed. To selectively process the HV regions and portion of the first sub-region, a resist mask 272 may be used to protect the other regions, such as a portion of the first sub-region and the entire second sub-region of the array region and LV regions while leaving the HV regions and wordline portion of the first sub-region $106_1$ exposed for processing as shown in FIG. 2h. Processing of the HV region and wordline portion of the first sub-region includes, for example, removing exposed oxide material in these regions. For example, floating gate dielectric layer in the HV regions and wordline portion of the first sub-region are removed by a wet etch process. The wet etch process also reduces thickness of the floating gate spacers in the first sub-region $106_1$. The thickness $T_{C1}$ of the floating gate spacers $266_1$ after the wet etch process is about 150 Å. Other suitable thickness dimensions may also be useful. As shown, the thickness $T_O$ of the floating gate spacers $266_2$ in the second sub-region $106_2$ remains unchanged at this stage since it is protected by the resist mask 272. The wet etch process, for example, employs dilute hydrofluoric acid (DHF). Other suitable etch chemistries may also be useful. The resist mask 272 is removed after the wet etch process. For example, the resist mask is removed by ashing followed by a resist clean.

Figure 2I:
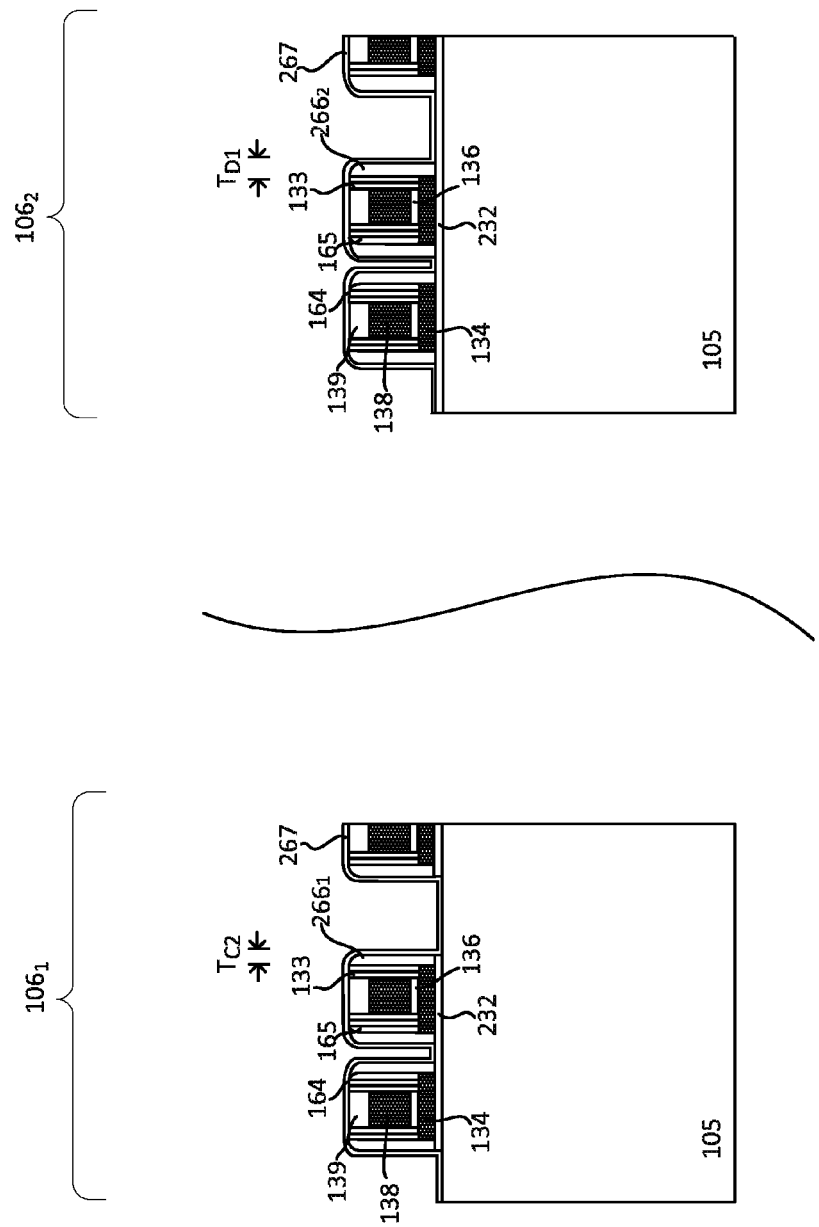
Figure 21:
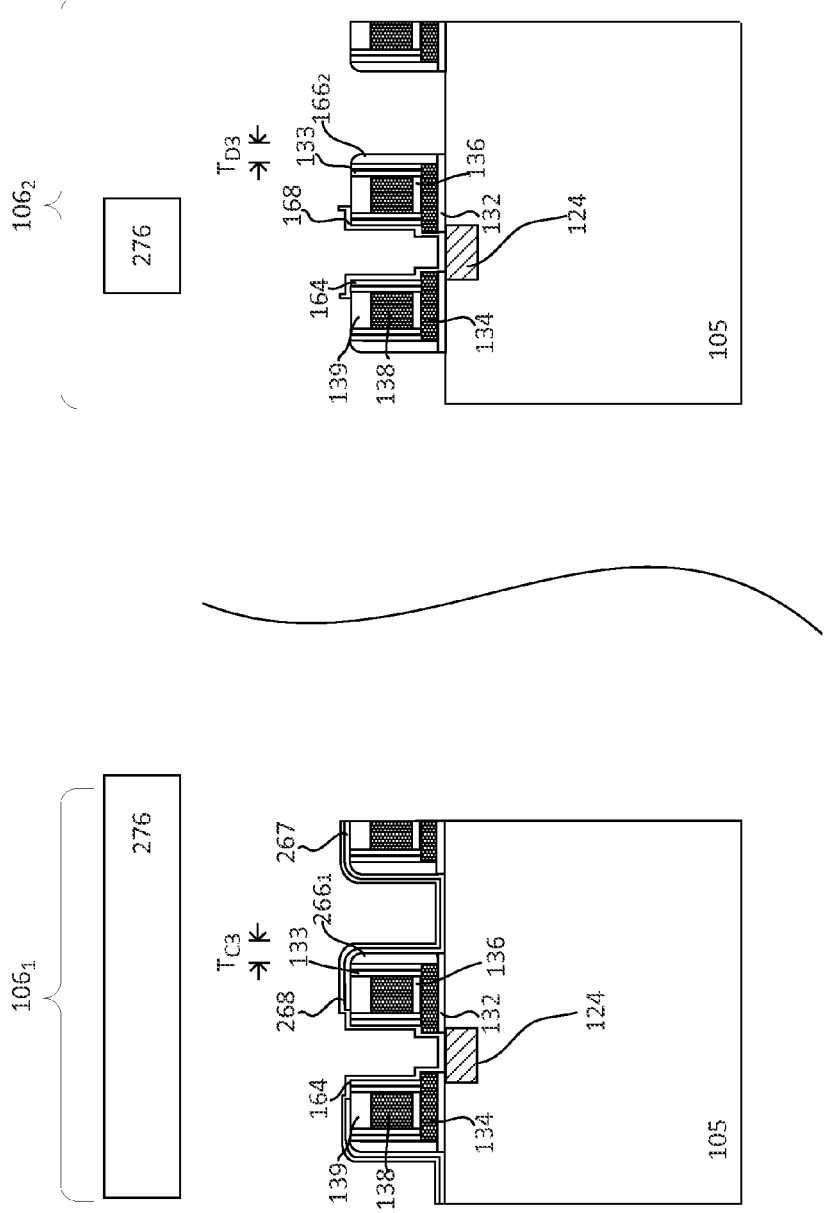

A HV oxide layer 267 is formed in the array and non-array regions on the substrate as shown in FIG. 2i. Forming the HV oxide layer may include a multi-step process. For example, a rapid thermal oxidation (RTO) is first performed to form a RTO oxide layer. Afterwards, a HTO oxide layer is formed. A HTO oxide layer is formed by, for example, CVD followed by a HTO anneal. Other suitable techniques for forming the HV oxide layer may also be useful. The thickness of the HV oxide layer 267, for example, is about 70 Å. Thus, the total thickness $T_{C2}$ of the floating gate spacer $266_1$ and HV oxide layer 267 in the first sub-region $106_1$, for example, is about 220 Å while the total thickness $T_{D1}$ of the floating gate spacer $266_2$ and HV oxide layer 267 in the second sub-region $106_2$, for example, is about 320 Å. Other suitable thickness dimensions may also be useful.

Referring to FIG. 2j, a buried SL 124 is formed between memory cells of a memory cell pair in the first and second sub-regions. In one embodiment, an implant is performed to form the buried SL. An implant mask 274, such as a photoresist mask, may be employed. The implant mask includes an opening exposing the substrate where the SL is to be formed. First polarity type dopants are implanted into the substrate to form the buried SL. The buried SL, for example, is a heavily doped region with first polarity type dopants. In one embodiment, the buried SL is disposed between the memory cells of a memory cell pair in the first and second sub-regions and extends a length of a row of memory cells.

After forming the SL in the first and second sub-regions, oxide materials exposed by the implant window of the mask is removed. For example, sacrificial spacers 165 and portions of exposed HV oxide layer 267 and floating gate dielectric layer 232 on the erase gate side of the first gates are removed. Removing the exposed oxide materials may be achieved using a wet etch selective to the substrate material, such as silicon. Other suitable techniques for removing the exposed oxide may also be useful. As shown, the floating gate dielectrics 132 are defined in the first sub-region $106_1$. The substrate may be annealed. For example, the substrate is annealed to diffuse the first polarity type dopants to form the buried SL. After annealing the substrate, the implant mask 274 is removed, for example, by ashing.

In FIG. 2k, an oxide layer 268 is formed on the substrate. The oxide layer, for example, is a HTO oxide layer. The HTO oxide layer is deposited by CVD and annealed. The HTO oxide layer is processed to form spacers on sidewalls of the erase gate side of the gates and a tunneling oxide over the SL. The thickness of the oxide layer 268, for example, is about 90 Å. Thus, the total thickness $T_{C3}$ of the floating gate spacer $266_1$, HV oxide layer 267 and oxide layer 268 in the first sub-region $106_1$, for example, is about 310 Å while the total thickness $T_{D2}$ of the floating gate spacer $266_2$, HV oxide layer 267 and oxide layer 268 in the second sub-region $106_2$, for example, is about 410 Å. Other suitable thickness dimensions may also be useful.

Referring to FIG. 2l, a resist mask 276 may be provided to protect the first sub-region $106_1$ of the array region. The resist mask 276, in one embodiment, also protects the erase gate side of the gates in the second sub-region $106_2$ from an etch while other regions, including the substrate between the access gate or wordline sides of the gates, are exposed. In one embodiment, the resist mask may also protect the HV regions from being processed, leaving the LV regions exposed. The etch removes exposed oxide materials. The etch may be a multi-etch process. For example, the etch may include a dry etch followed by a wet etch. The wet etch process, for example, employs DHF. Other unable etch chemistries may also be useful.

In one embodiment, the dry etch reduces thickness of the exposed oxide layer 268 while the wet etch process removes the remaining exposed oxide layer 268 and the exposed HV oxide layer 267. As shown, the oxide layer 268 and the HV oxide layer 267 in the region between the access gate or wordline sides of the gates are completely removed. The wet etch, in one embodiment, also reduces the thickness of the exposed floating gate spacers and removes exposed floating gate dielectric layer 232 in the second sub-region $106_2$. The resultant floating gate spacers $166_2$ after the dry and wet etch processes in the second sub-region $106_2$, for example, correspond to main portion of the wordline-floating gate gap oxides. As shown, the etch process defines the thickness $T_{D3}$ of the resultant floating gate spacers $166_2$ in the second sub-region such that it is suitable for second voltage, such as 2.5V, applications. For example, the thickness $T_{D3}$ of the resultant floating gate spacers $166_2$ is about 200 Å. The etch, for example, also defines the oxide layer 268 to form spacers and tunneling oxide layer 168 over the SL and defines the floating gate dielectrics 132 in the second sub-region $106_2$. Referring to FIG. 2l, the total thickness $T_{C3}$ in the first sub-region $106_1$ remains unchanged at this stage since it is protected by the resist mask 276. Active regions in the LV regions exposed by the mask may also be processed to remove the floating gate dielectric layer which includes oxide material to expose the substrate. After processing, the resist mask 276 is removed by, for example, ashing.

The process continues to form wordline dielectric $142_2$ on the substrate for the access gate or wordline in the second sub-region $106_2$, as shown in FIG. 2m. In one embodiment, a thermal oxide is performed to form access gate or wordline dielectric $142_2$ in the second sub-region $106_2$. The thermal oxide is formed on the whole substrate, including the first sub-region of the array region and logic regions. As shown, this also forms an erase gate dielectric $170_2$ over the buried SL in the second sub-region.

The LV regions of the logic regions may include first and second regions having different gate oxide thicknesses. For example, LV regions may include I/O and core regions having first and second gate dielectric thicknesses. In one embodiment, forming the wordline dielectric $142_2$ in the second sub-region $106_2$ also forms first gate dielectric (not shown) in the logic I/O and core regions (not shown). The thickness of the wordline dielectric in the second sub-region $106_2$ and the first gate dielectric in the LV regions, for example, is suitable for use as I/O gate dielectric. The thickness of the wordline dielectric in the second sub-region and the first gate dielectric in the LV regions, for example, is about 58 Å. Other suitable thickness dimensions may also be useful, depending on the desired thickness suitable for logic I/O gate dielectric.

Figure 2N:
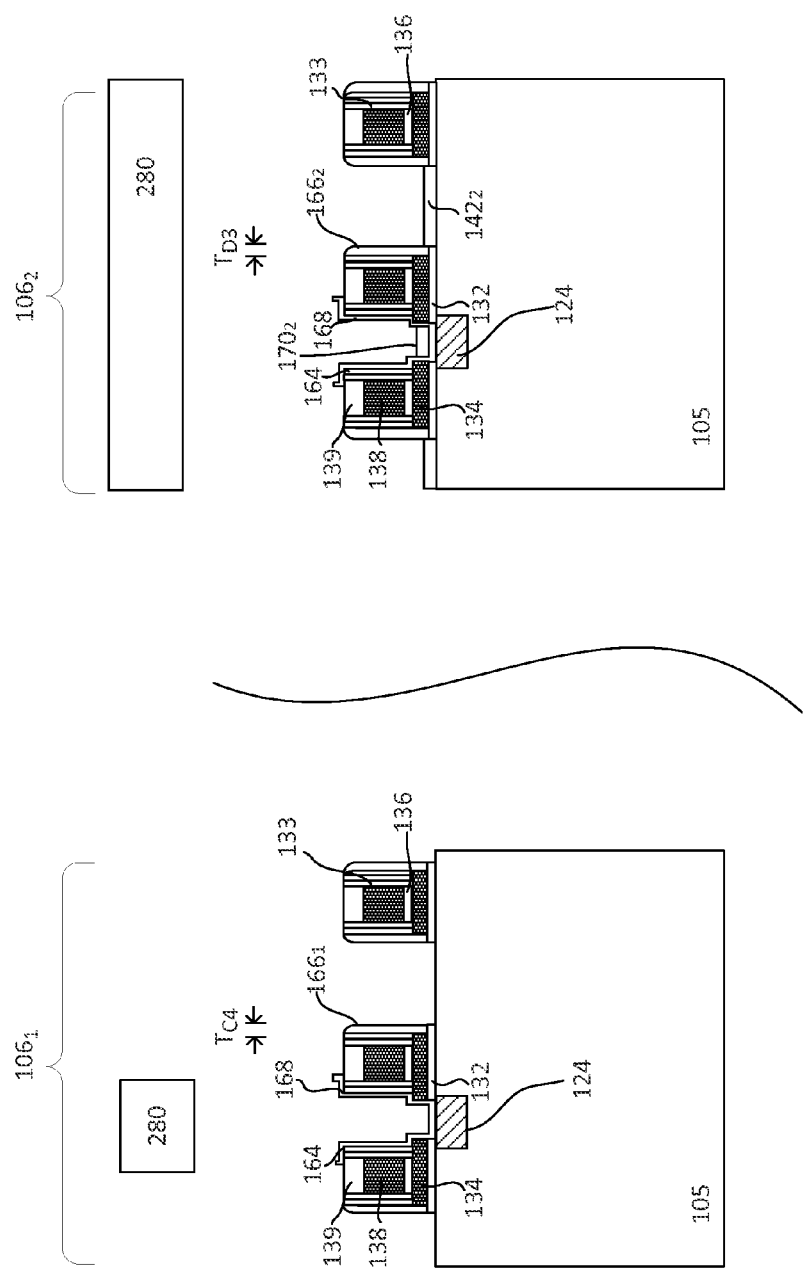

Referring to FIG. 2n, a resist mask 280 may be provided to protect the second sub-region $106_2$ of the array region. The resist mask 280, in one embodiment, also protects the erase gate side of the gates in the first sub-region $106_1$ from an etch while other regions, including the substrate between the access gate or wordline sides of the gates, are exposed. In one embodiment, the resist mask may also protect the HV regions and LV I/O region from being processed, leaving the second LV or core region exposed. The etch removes exposed oxide materials. The etch, for example, may include a wet etch. The wet etch process, for example, employs DHF. Other suitable etch chemistries may also be useful.

In one embodiment, the wet etch process removes the exposed oxide layer 268 and the exposed HV oxide layer 267 in the first sub-region $106_1$. As shown, the oxide layer 268 and the HV oxide layer 267 in the region between the access gate or wordline sides of the gates are completely removed. The wet etch, in one embodiment, also reduces the thickness of the exposed floating gate spacers in the first sub-region $106_1$. The resultant floating gate spacers $166_1$ after the wet each process in the first sub-region $106_1$, for example, correspond to main portion of the wordline-floating gate gap oxides. As shown, the etch process defines the thickness $T_{C4}$ of the resultant floating gate spacers $166_1$ in the first sub-region such that it is suitable for use in first voltage, such as 1.2V, applications. For example, the thickness $T_{C4}$ of the resultant floating gate spacers $166_1$ is about 180 Å. Other suitable thickness dimensions may also be useful. The etch, for example, also defines the oxide layer 268 to form spacers and tunneling oxide layer 168 over the SL in the first sub-region $106_1$. Referring to FIG. 2n, the total thickness $T_{D3}$ in the second sub-region $106_2$ remains unchanged at this stage since it is protected by the resist mask 280. Active regions in the LV core region exposed by the mask may also be processed to remove the first gate dielectric layer which includes oxide material to expose the substrate. After processing, the resist mask 280 is removed by, for example, ashing.

The process continues to form wordline dielectric $142_1$ on the substrate for the access gate or wordline in the first sub-region $106_1$, as shown in FIG. 2o. In one embodiment, a thermal oxide is performed to form access gate or wordline dielectric $142_1$ in the first sub-region $106_1$. The thermal oxide is also formed in the exposed second sub-region of the array region and the logic or LV core region. As shown, this also forms an erase gate dielectric $170_1$ over the buried SL in the first sub-region.

In one embodiment, forming the wordline dielectric $142_1$ in the first sub-region $106_1$ also forms second gate dielectric (not shown) in the second LV or core region. The thickness of the wordline dielectric in the first sub-region $106_1$ and the second or core gate dielectric in the logic LV region, for example, is suitable for use as logic core gate dielectric. The thickness of the wordline dielectric in the first sub-region and the second gate dielectric in the logic core region, for example, is about 25 Å. Other suitable thickness dimensions may also be useful.

Referring to FIG. 2p, wordlines 140 and an erase gate 150 over the buried SL are formed. In one embodiment, forming the wordlines and erase gates also forms gates in the logic regions, including and LV regions. To form the gates, gate electrode layers are formed over the substrate. The gate electrode layers fill the gaps and cover the storage gates in the array region and gate dielectric layers in the HV and LV regions. The gate electrode layers, for example, are polysilicon. The polysilicon may be doped polysilicon, for example, to reduce sheet resistance. The polysilicon may be doped with first polarity type dopants.

In one embodiment, first and second gate electrode layers are formed on the substrate. The gate electrode layers are separated by an etch stop layer in the logic region. This can be achieved by depositing the etch stop layer over the first gate electrode layer and patterning it to remove it from the array region prior to forming the second gate electrode layer. The height of the first electrode layer is equal to about the desired height of the gates in the logic regions. The top surface of the etch stop layer may be slightly above or below a top surface of the hard mask over the storage gates. In one embodiment, the top surface of the etch stop layer is disposed slightly below the top surface of the hard mask over the storage gates. The etch stop layer, for example, is an oxide layer. Other suitable type of etch stop layers may also be useful. The use of the etch stop layer facilitates forming gates in the array region having a different height than the gates in the logic regions. For example, the etch stop layer facilitates forming gates in the array region having a higher height than the gates in the logic regions.

An etch back is performed to recess the gate electrode layer to a desired height in the array region. For example, the etch back recesses the gate electrode layers to the height of the erase gates and wordlines. In the case where the etch stop layer is slightly below the height of the hard mask layer over the storage gates, gate electrode material over the etch stop layer is removed to expose the etch stop layer. An etch is performed to remove the etch stop layer. For example, the etch may be a wet etch selective to substrate material, such as silicon. The etch removes the etch stop layer, exposing the first gate electrode layer in the logic regions.

The gate electrode layer or layers are patterned to form wordlines in the array region and gates in the logic regions. In one embodiment, a mask, such as a resist mask, is employed to pattern the gate electrode layer to form the gates. The mask protects the region over the erase gate 150, since it is already formed, and other regions where wordlines 140 and logic gates are formed. The etch, for example, is a RIE. After the gates are formed, sidewall spacers 169 are formed on sidewalls of the wordlines and exposed portions of the storage gate as well as sidewalls of the logic gates.

Source/drain regions or first cell terminals 122 of transistors and memory cells are formed after forming the gates. Source/drain regions of the logic transistors may also be formed. In the case of first and second polarity type transistors, the source/drain regions are formed using separate implant processes. In one embodiment, LDD and halo regions are formed prior to forming spacers and source/drain regions are formed after spacer formation.

The process continues with back end of line (BEOL) processing to form interconnects and passivation (not shown). After BEOL is completed, the wafer is diced into individual chips, assembled and tested. Other suitable processes may also be included.

The embodiments as described result in advantages. For example, memory cells suitable for operating in different voltages may be formed on the same substrate without compromising the reliabilities of the memory cells with various voltages and the logic devices. For example, the process as described allows the desired final wordline-floating gate gap oxide for memory cells of different voltages to be achieved. Since the desired final wordline-floating gate gap oxide is achieved for the respective memory cells with different voltage regions, removal process to reduce the thickness of the wordline-floating gap oxide is avoided. Thus, the process as describes avoids or minimizes the impact on logic core devices and avoids the risk of remaining wordline dielectric prior to thin gate oxide growth. Moreover, the method as described in FIGS. 2a-2p is highly compatible with current and any suitable logic processing and no additional investment in new equipment is required. Therefore, a more reliable NVM device which is suitable for use in first and second voltages, such as but not limited to 1.2 V and 2.5 V, can be formed together with logic devices without incurring additional manufacturing costs.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
providing a substrate prepared with at least a memory cell region having first and second sub-regions and a logic region having input/output (I/O) region and core region;
forming first voltage memory cell in the first sub-region and forming second voltage memory cell in the second sub-region of the memory cell region of the same substrate, wherein the first voltage memory cell operates in a first voltage and the second voltage memory cell operates in a second voltage which is higher than the first voltage, wherein forming each of the first and second voltage memory cells comprises
forming a split gate having first and second gates, wherein the first gate is a storage gate having a control gate over a floating gate and the second gate is a wordline; and
forming logic I/O device in the I/O region and logic core device in the core region.

2. The method of claim 1 wherein forming each of the first and second voltage memory cells comprises:
forming floating gate spacer which corresponds to main portion of the wordline-floating gate gap oxide in between the floating gate and wordline, wherein the floating gate spacer of the first sub-region has a final thickness which is thinner relative to a final thickness of the floating gate spacer of the second sub-region.

3. The method of claim 1 wherein forming each of the first and second voltage memory cells comprises:
forming first source/drain (S/D) region adjacent to the second gate and second S/D region adjacent to the first gate, wherein the first and second gates are coupled in series and the second S/D region being a common S/D region for adjacent first and second memory cells; and
forming an erase gate over the common S/D region.

4. The method of claim 3 wherein forming the split gate comprises:
forming a floating gate dielectric layer over the substrate;
forming a floating gate electrode layer over the floating gate dielectric layer;
forming a storage gate dielectric layer over the floating gate electrode layer;
forming a control gate electrode layer over the storage gate dielectric layer; and forming a hard mask layer over the control gate electrode layer.

5. The method of claim 4 wherein forming the split gate comprises:
patterning the hard mask, control gate electrode and storage gate dielectric layers to define the control gate and storage gate dielectric by an etch process, wherein the etch stops at top surface of the floating gate electrode layer and wherein width of the control gate in the first sub-region is defined such that it is for use in the first voltage while width of the control gate in the second sub-region is defined such that it is for use in the second voltage.

6. The method of claim 5 wherein forming the split-gate comprises:
forming first sidewall spacers on sidewalls of the patterned hard mask, control gate and storage gate dielectrics;
forming second sidewall spacers on sidewalls of the first sidewall spacers;
forming sacrificial spacers on sidewalls of the second sidewall spacers;
performing a gate threshold voltage (Vt) adjustment implant in regions of the substrate where second gates are to be formed; and
removing the sacrificial spacers which are formed on second gate side of the control gates after performing the Vt adjustment implant.

7. The method of claim 6 wherein forming the split-gate comprises:
patterning the floating gate electrode layer after performing the Vt adjustment implant, wherein second gate side of the patterned floating gate are aligned with the second sidewall spacer while erase gate side of the floating gate extends beyond the second sidewall spacer and wherein width of the floating gate in the first sub-region is defined such that it is for use in the first voltage while width of the floating gate in the second sub-region is defined such that it is for use in the second voltage.

8. The method of claim 7 comprising:
forming floating gate spacers having first thickness ($T_O$) on sidewalls of the first gate;
providing a first mask to protect a portion of the first sub-region and the entire second sub-region; and
removing a portion of the floating gate dielectric layer exposed in wordline portion of the first sub-region and reduces thickness of the floating gate spacer on second gate side of the floating gate to a second thickness $T_{C1}$ in the first sub-region.

9. The method of claim 8 comprising:
forming a high voltage (HV) oxide layer over the substrate, wherein the floating gate spacer on second gate side of the floating gate and HV oxide layer in the first sub-region comprise a total thickness of $T_{C2}$ while the floating gate spacer on second gate side of the floating gate and HV oxide layer in the second sub-region comprise a total thickness of $T_{D1}$.

10. The method of claim 9 wherein:
the common S/D region adjacent to the first gates of adjacent first and second memory cells is a buried source line (SL) and wherein the buried SL is formed by performing an implant process to implant first polarity type dopants in region of the substrate between the first gates of adjacent first and second memory cells in respective first and second sub-regions.

11. The method of claim 10 comprising:
removing sacrificial spacers, portion of HV oxide layer and floating gate spacer which are formed on erase gate side of the first gates adjacent to the buried SL; and
forming a tunneling oxide layer over the substrate, wherein the floating gate spacer on the second gate side of the floating gate, HV oxide layer and tunneling oxide layer in the first sub-region comprise a total thickness of $T_{C3}$ while the floating gate spacer on the second gate side of the floating gate, HV oxide layer and tunneling oxide layer in the second sub-region comprise a total thickness of $T_{D2}$.

12. The method of claim 11 comprising:
providing a second mask to protect a portion of the second sub-region and the entire first sub-region; and
removing the tunneling oxide layer, HV oxide layer and a portion of the floating gate dielectric layer exposed in wordline portion of the second sub-region and reduces thickness of the floating gate spacer on second gate side of the floating gate to a thickness $T_{D3}$ in the second sub-region.

13. The method of claim 12 comprising forming a wordline dielectric in wordline portion of the second sub-region, wherein forming the wordline dielectric also forms logic gate dielectric in the logic I/O region.

14. The method of claim 13 comprising:
providing a third mask to protect a portion of the first sub-region and the entire second sub-region; and
removing the tunneling oxide layer and HV oxide layer in wordline portion of the first sub-region and reduces thickness of the floating gate spacer on second gate side of the floating gate to a thickness $T_{C4}$ in the first sub-region.

15. The method of claim 14 comprising forming a wordline dielectric in wordline portion of the first sub-region, wherein forming the wordline dielectric also forms logic core gate dielectric in the logic core region.

16. A device comprising:
a substrate which comprises at least a memory cell region having first and second sub-regions and a logic region having input/output (I/O) region and core region;
first voltage memory cell disposed in the first sub-region and second voltage memory cell disposed in the second sub-region of the memory cell region of the same substrate, wherein the first voltage memory cell operates in a first voltage and the second voltage memory cell operates in a second voltage which is higher than the first voltage, wherein each of the first and second voltage memory cells comprises
a split gate having first and second gates, wherein the first gate is a storage gate having a control gate over a floating gate and the second gate is a wordline; and
logic I/O device disposed in the I/O region and logic core device disposed in the core region.

17. The device of claim 16 wherein each of the first and second voltage memory cells comprises:
floating gate spacer which corresponds to main portion of the wordline-floating gate gap oxide in between the floating gate and wordline, wherein the floating gate spacer of the first sub-region has a thickness which is thinner relative to a thickness of the floating gate spacer of the second sub-region.

18. The device of claim 17 wherein each of the first and second voltage memory cells comprises:
first source/drain (S/D) region adjacent to the second gate and second S/D region adjacent to the first gate, wherein the first and second gates are coupled in series and the second S/D region being a common S/D region for adjacent first and second memory cells; and an erase gate over the common S/D region.

19. The device of claim 18 wherein each of the first and second voltage memory cells comprises a wordline dielectric in wordline portion of the first and second sub-regions, wherein the wordline dielectric in the second sub-region comprises a thickness which is the same as a thickness of a logic I/O gate dielectric disposed in the logic I/O region.

20. The device of claim 19 wherein the wordline dielectric in the first sub-region comprises a thickness which is the same as a thickness of a logic core gate dielectric disposed in the logic core region.

* * * * *